(12) United States Patent
Jeong

(10) Patent No.: US 7,629,093 B2
(45) Date of Patent: Dec. 8, 2009

(54) METHOD FOR CORRECTING CRITICAL DIMENSION OF MASK PATTERN

(75) Inventor: Soo Kyeong Jeong, Busan-si (KR)

(73) Assignee: Hynix Semiconductor Inc., Icheon-shi (KR)

( * ) Notice: Subject to any disclaimer, the term of this patent is extended or adjusted under 35 U.S.C. 154(b) by 0 days.

(21) Appl. No.: 12/346,925

(22) Filed: Dec. 31, 2008

(65) Prior Publication Data
US 2009/0226827 A1 Sep. 10, 2009

(30) Foreign Application Priority Data
Mar. 5, 2008 (KR) .................... 10-2008-0020707

(51) Int. Cl.
*G03F 9/00* (2006.01)
(52) U.S. Cl. .............................. 430/30; 430/5; 430/22; 430/313; 430/314
(58) Field of Classification Search .................. 430/5, 430/22, 30, 313, 314
See application file for complete search history.

(56) References Cited

U.S. PATENT DOCUMENTS
7,444,616 B2   10/2008   Sandstrom et al.

FOREIGN PATENT DOCUMENTS
KR   10 2007 0068910   7/2007

*Primary Examiner*—Christopher G Young
(74) *Attorney, Agent, or Firm*—Marshall, Gerstein & Borun LLP

(57) ABSTRACT

A method for correcting a critical dimension (CD) of a mask pattern includes forming an light shielding layer over a substrate including a main cell region and a frame region at a periphery of the main cell region; forming an light shielding main pattern in the main cell region and a frame pattern in the frame region by patterning the light shielding layer; measuring a CD of the light shielding main pattern; extracting a CD correction amount from the measured CD; self-aligning a conductive high polymer layer over the frame pattern with electrochemical polymerization; correcting the CD of the main pattern depending on the CD correction amount by performing etch on the main pattern exposed by the conductive high polymer layer; and selectively removing the conductive high polymer layer.

8 Claims, 6 Drawing Sheets

METHOD FOR CORRECTING CRITICAL DIMENSION OF MASK PATTERN

CROSS-REFERENCE TO RELATED APPLICATION

The priority of Korean patent application number 10-2008-0020707 filed Mar. 5, 2008, the entire disclosure of which is incorporated by reference, is claimed.

BACKGROUND OF THE INVENTION

The invention relates generally to a photomask and, more particularly, to a method for correcting a critical dimension of a mask pattern.

A photomask acts to transfers a pattern including an light shielding layer or a phase shift layer on a substrate to a wafer to form a desired pattern. A binary mask has been used as a photomask, in which an light shielding layer is formed on a substrate and then is etched to a desired pattern so that light can be transferred onto the wafer by passing through the substrate alone. However, as the degree of integration of semiconductor devices has increased, a mask capable of forming a finer pattern on the wafer as compared to the binary mask is required. Accordingly, a phase shift mask capable of finer pattern on the wafer using a phase shift material having a transmittance of several percent has been suggested and used. However, it is difficult to accurately realize a target critical dimension (CD) as the CD of a pattern formed on the mask has decreased with decreases of the design rule according to the high degree of integration of semiconductor devices.

Therefore, to more accurately realize the target CD, in the process of fabricating the phase shift mask, a phase shift layer and an light shielding layer are formed on a wafer and then a first patterning process is performed to form an light shielding layer pattern on a main cell region and a frame region. Subsequently, a difference between a CD of the light shielding layer pattern and the target CD is measured. Next, the CD of the light shielding layer pattern is corrected by a correction amount of the measured CD. However, due to the CD correction process, the process steps become complex as a resist layer pattern is formed on the light shielding layer pattern by forming and patterning the resist layer on the substrate and then the light shielding layer pattern is etched using the resist layer pattern as an etch mask. Also, the occurrence of defects increases as the resist layer is applied in the CD correction process, and problems may occur, such as the formation of bridge defects by which patterns are undesirably interconnected. Also, it is difficult to control organic defects such as residues on the resist layer. Thus, while it is possible to realize the target CD by the CD correction process, the mask should be discarded due to generation of uncontrollable defects. Therefore, a method capable of correcting the pattern CD as well as improving the cause generating the defect is needed.

SUMMARY OF THE INVENTION

In one embodiment, a method for correcting a critical dimension (CD) of a mask pattern includes: forming an light shielding layer over portions of a substrate that define a main cell region and a frame region at a periphery of the main cell region; patterning the light shielding layer to form an light shielding main pattern in the main cell region and a frame pattern in the frame region; measuring a CD of the light shielding main pattern to obtain a measured CD; extracting a CD correction amount from the measured CD; self-aligning a conductive high polymer layer over the frame pattern by electrochemical polymerization, said main pattern remaining exposed by the conductive high polymer layer; correcting the CD of the main pattern based on the CD correction amount by etching the main pattern exposed by the conductive high polymer layer; and selectively removing the conductive high polymer layer.

The forming the conductive high polymer layer preferably includes placing the substrate in an electrolytic bath filled with electrolyte; introducing a counter electrode in the electrolyte and introducing a working electrode to the frame pattern; supplying monomer to be polymerized to the bath; and forming the conductive high polymer layer by inducing polymerization of the monomer over the frame pattern connected to the working electrode by applying a potential to the counter electrode and the working electrode.

The conductive high polymer layer preferably comprises a polypyrrole layer.

Removing the conductive high polymer layer is preferably performed by providing oxygen plasma onto the conductive high polymer layer.

In another embodiment, a method for correcting a critical dimension (CD) of a mask pattern includes forming a phase shift layer and an light shielding layer over a substrate that defines a main cell region and a frame region at a periphery of the main cell region; patterning the light shielding layer to form an light shielding main pattern in the main cell region and a frame pattern in the frame region; measuring a CD of the light shielding main pattern to obtain a measured CD; extracting a CD correction amount from the measured CD; self-aligning a conductive high polymer layer over the frame pattern by electrochemical polymerization, said main pattern remaining exposed; correcting the CD of the main pattern based on the CD correction amount by etching the main pattern exposed by the conductive high polymer layer; forming a phase shift pattern by selectively removing an exposed portion of the phase shift layer using the main pattern with corrected CD as an etch mask; exposing the phase shift pattern over the main region by selectively removing the main pattern with the frame pattern remaining; and selectively removing the conductive high polymer layer Forming the conductive high polymer layer preferably includes placing the substrate in an electrolytic bath filled with electrolyte; introducing a counter electrode in the electrolyte and introducing a working electrode to the frame pattern; supplying monomer to be polymerized to the inside of the bath; and forming the conductive high polymer layer by inducing polymerization of the monomer over the frame pattern connected to the working electrode by applying a potential to the counter electrode and the working electrode.

DESCRIPTION OF SPECIFIC EMBODIMENTS

Hereinafter, a method for correcting a critical dimension of a mask pattern in accordance with the invention is described in detail with reference to the accompanying drawings.

Figure 5A:
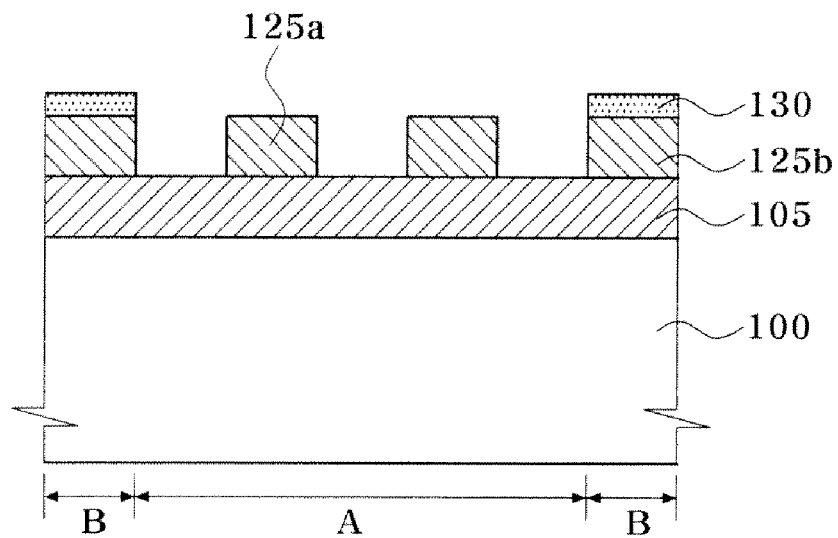
Figure 5B:
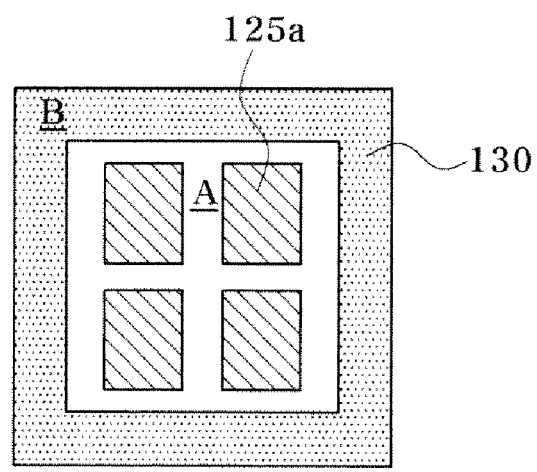
Figure 6:
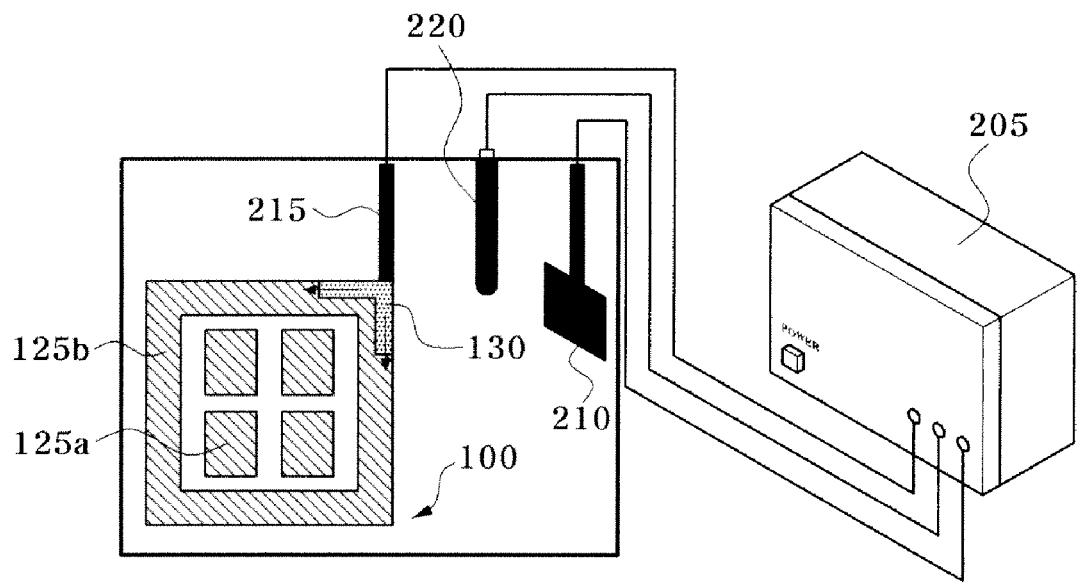

FIGS. 1 through 10 illustrate a method for correcting a critical dimension of a mask pattern according to an embodiment of the invention. Particularly, FIG. 6 schematically illustrates an apparatus used in an electrochemical polymerization reaction of the invention.

Figure 1:
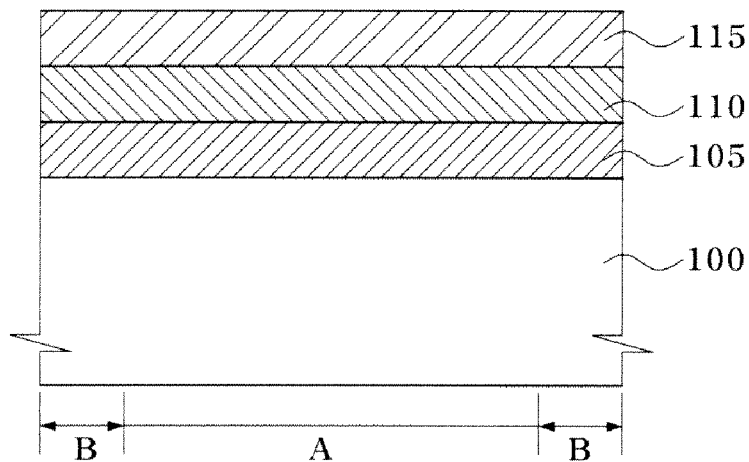
FIGS. 1 through 10 illustrate a method for correcting a critical dimension of a mask pattern according to an embodiment of the invention.

Referring to FIG. 1, a phase shift layer 105 and an light shielding layer 110 are deposited over a substrate 100. Herein, the substrate 100 includes quartz, and made of a transparent material capable of transmitting light. Herein, a main cell region A and a frame region B disposed at a periphery of the main cell region A are defined in the substrate 100. The phase shift layer 105 deposited over the substrate 100 is made of a material capable of shifting a phase of the light irradiated onto the substrate 100 during an exposure process to be performed later. This phase shift layer 105 may be formed including a compound containing molybdenum, for example, molybdenum silicon nitride layer (MoSiN). The light shielding layer 110 formed over the phase shift layer 105 blocks the light transmitted through the substrate 100 during the exposure process to be performed later. This light shielding layer 110 may be formed including a chrome layer (Cr). Next, a resist layer 115 is formed over the light shielding layer 110. This resist layer 115 may be formed of a photoresist material.

Figure 2:
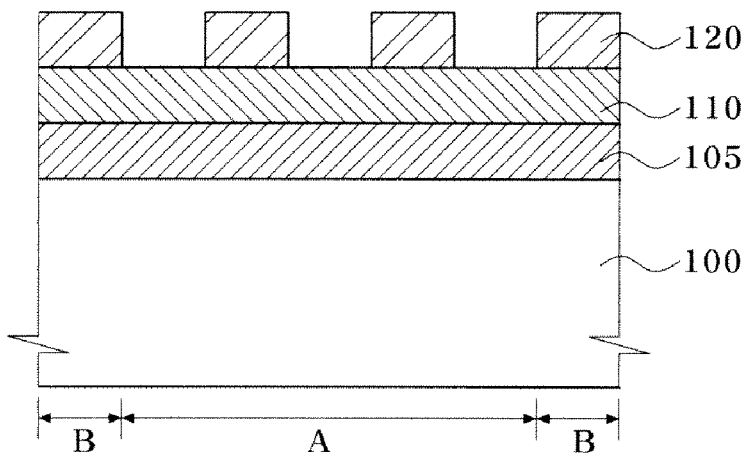

Referring to FIG. 2, a resist layer pattern 120 that selectively exposes the light shielding layer 110 is formed by patterning the resist layer 115 (refer to FIG. 1) Preferably, a lithography process including exposure and development process is performed on the resist layer 115. Then, a solubility difference due to a photochemical reaction is generated in the resist layer irradiated with light. A resist layer pattern 120 that selectively exposes the light shielding layer 110 is formed by removing the portion that represents the solubility difference using a developing solution. Herein, the resist layer pattern 120 defines a main pattern to be formed in the main cell region A and a frame pattern to be formed in the frame region B.

Figure 3:
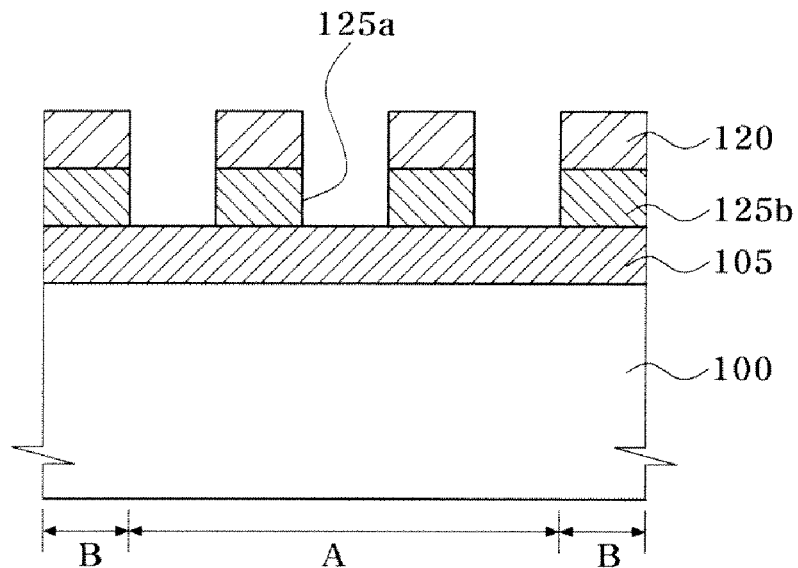

Referring to FIG. 3, an light shielding main pattern 125*a* in the main cell region A and a frame pattern 125*b* in the frame pattern B are formed by etching the exposed portion of the light shielding layer pattern 110 using the resist layer pattern 120 as an etch mask. The light shielding main pattern 125*a* and the frame pattern 125*b* selectively expose the phase shift layer 105.

Figure 4:
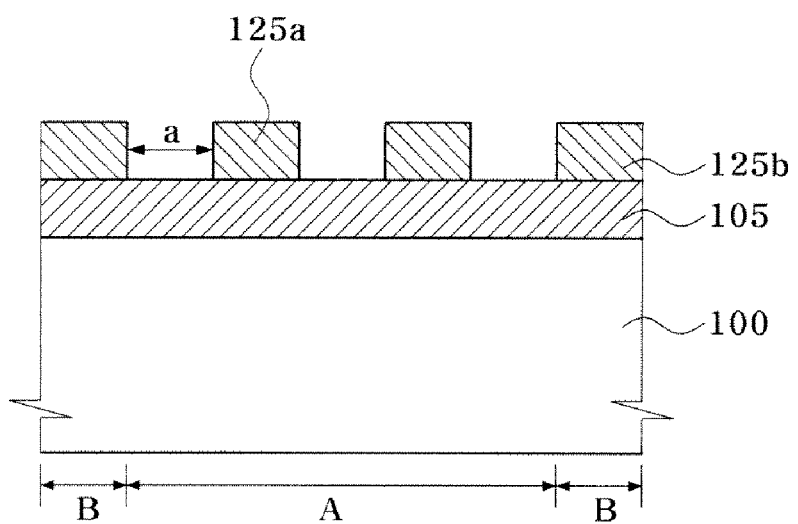

Referring to FIG. 4, the resist layer pattern 120 (refer to FIG. 3) is stripped. The resist layer pattern 120 is preferably stripped by an ashing process using oxygen ($O_2$) plasma. Next, a CD of the light shielding main pattern 125*a* formed over the substrate is measured using a CD measuring apparatus. At this time, the CD of the light shielding main pattern 125*a* may be outside of a target range due to a factor resulting from a process of forming the pattern. When the mask is formed in a state that the CD is out of the target range, a defect may be generated in the final pattern to be formed over the wafer. Therefore, it is preferred to determine a CD correction amount of the light shielding main pattern 125*a* according to the measured CD and to correct the CD.

Referring to FIGS. 5*a* through 6, a conductive high polymer layer 130 is self-aligned over the frame pattern 125*b* in the frame region B by electrochemical polymerization. Specifically, the substrate 100 formed with the light shielding main pattern 125*a* and the frame pattern 125*b* is placed in an inside of an electrolytic bath 200 in FIG. 6. The bath 200 in which the substrate 100 is placed is filled with electrolyte. Illustratively, the bath 200 is connected with a potentiostat/galvanostat 205, and the potentiostat/galvanostat 205 connects a reference electrode 210, a working electrode 215, and a counter electrode 220 with the bath 200. At this time, the reference electrode 210 acts to maintain the inside of the bath 200 at a fixed potential while monitoring the potential of the working electrode 215. This reference electrode 210 is made of silver/silver chloride (Ag/AgCl). The working electrode 215 is connected with the frame pattern 125*b*. Also, the counter electrode 220 is illustratively made of platinum (Pt), and when the electrochemical reaction is generated at the working electrode 215, a counter reaction is generated at the counter electrode 220.

The electrochemical polymerization of the high polymer is generated by oxidative polymerization of monomer supplied to the electrolytic solution using a predetermined positive electrode potential. Thus, a conductive high polymer layer is formed over a surface of a metal by electrically oxidizing the monomer by continuously circulating the potential from a negative electrode (−) to a positive electrode (+). In this electrochemical polymerization of high polymer, since the high polymer is made only by applying a specific voltage or current, the reaction is relatively simple and the high polymer is formed in a uniform thickness. The electrochemical polymerization of high polymer can be varied according to the nature of the high polymer material or the electrolyte. In the illustrated embodiment, the electrochemical polymerization is performed on an electrolytic base, and the reference electrode 210, the counter electrode 220, and the working electrode 215 are connected with the substrate 100. Next, monomer to be polymerized, for example, pyrrole (Py) monomer is supplied to the electrolyte. Next, the monomer in the electrolyte is electrically oxidized by applying power to the potentiostat/galvanostat 205 and continuously circulating the potential from the negative electrode (−) to the positive electrode (+). Then, the conductive high polymer layer 130 is coated over the frame pattern 215*b* in the direction of the arrow in FIG. 6. Therefore, the conductive high polymer layer including a polypyrrole film is formed over the frame pattern 215*b* in the frame region B as shown in FIGS. 5*a* and 5*b*. Herein, the potentiostat/galvanostat 205 maintains the potential of the working electrode 215 with respect to the reference electrode 210 during the reaction process. At this time, FIG. 5*b* is a top plan view of FIG. 5*a*.

Figure 7:
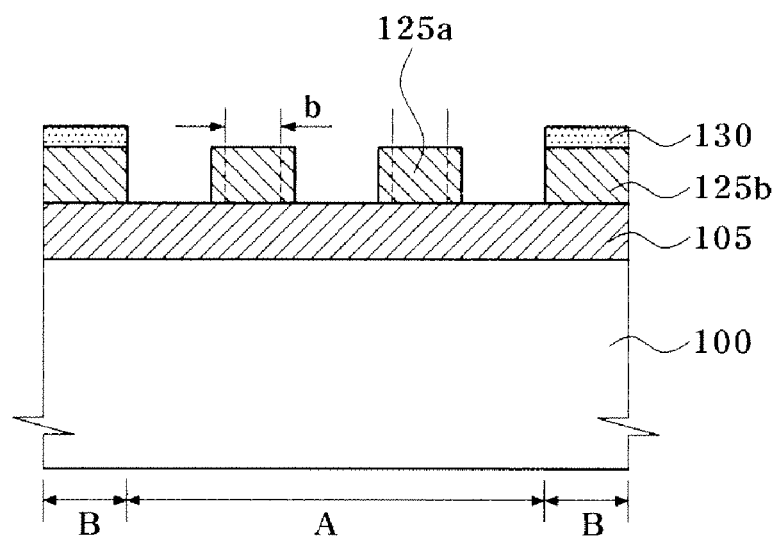

Referring to FIG. 7, the CD of the light shielding main pattern 125*a* is corrected by etching the main pattern 125*a* exposed by the conductive high polymer layer 130. Specifically, additional etching is performed on the light shielding main pattern 125*a* by a CD correction amount using the conductive high polymer layer 130 formed over the frame pattern 125*b* as a barrier layer. The conductive high polymer layer 130 that blocks the frame pattern 125*b* is not influenced by materials used in the additional etch process since it has excellent mechanical physical properties and thermal stability. Therefore, the frame pattern 125*b* in the frame region B is not damaged by the additional etch process.

Figure 8:
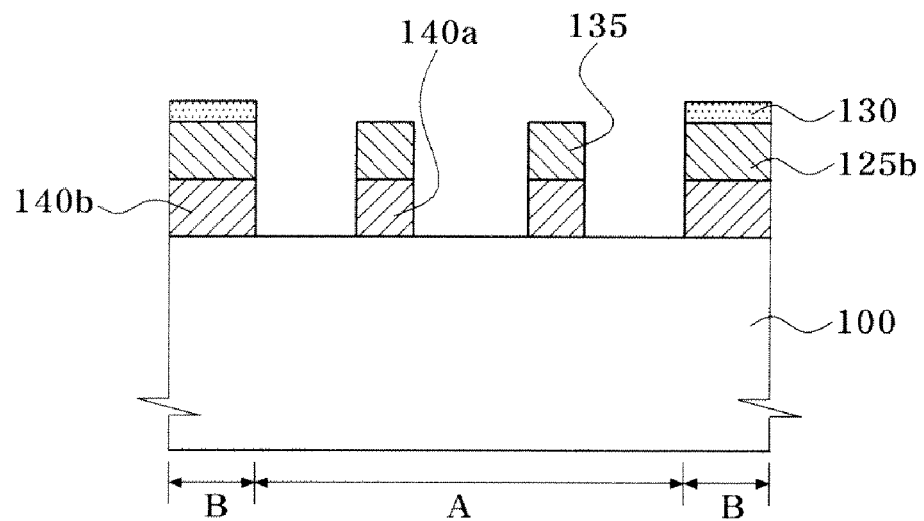

Referring to FIG. 8, a phase shift layer main pattern 140*a* and a phase shift layer frame pattern 140*b* are formed by etching the exposed portion of the phase shift layer 105 using the light shielding main pattern 135 with corrected CD and the frame pattern 125*b*. Herein, the phase shift main pattern 140 *a* is formed in the same CD as the light shielding main pattern 135 of which CD is corrected by the additional etch.

Figure 9:
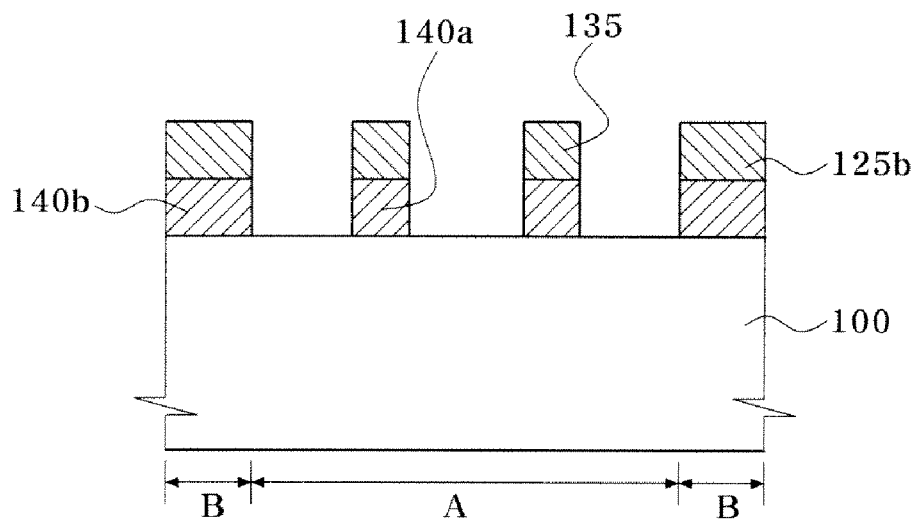
Figure 10:
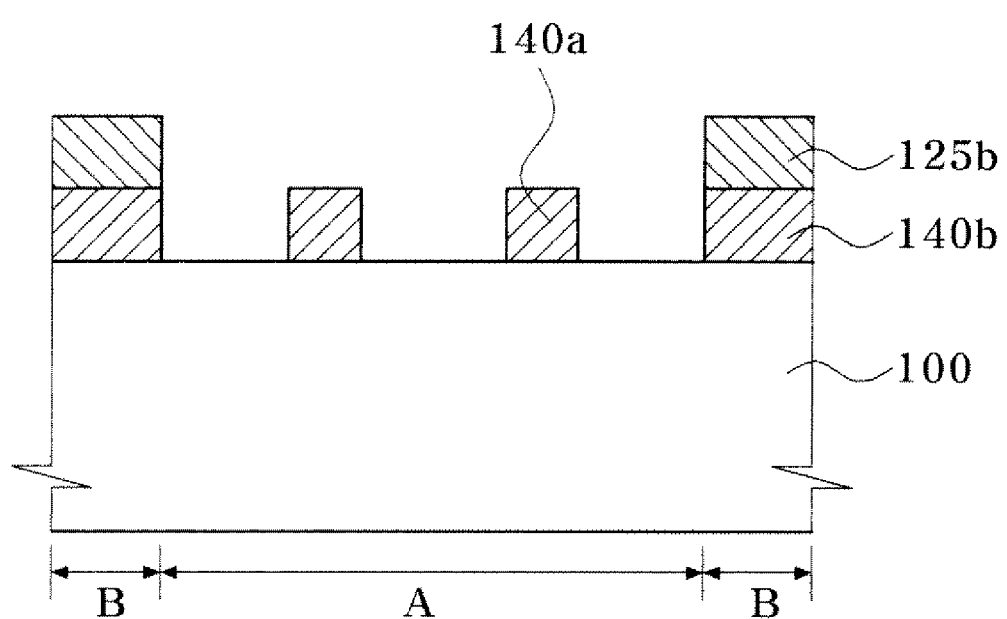

Referring to FIG. 9, the conductive high polymer layer 130 formed over the frame pattern 125*b* is removed. The conductive high polymer layer 130 is illustratively removed by performing an ashing process that provides oxygen ($O_2$) plasma. And, when the light shielding main pattern 135 is removed, a phase shift mask including the phase shift main pattern 140*a*, the phase shift frame pattern 140*b* and the frame pattern 125*b* is formed over the substrate 100 as shown in FIG. 10. Herein, the portion blocked by the phase shift frame pattern 140*b* and the frame pattern 125*b* becomes an light shielding region and the portion in which the phase shift main pattern 140 is exposed becomes a phase shift region. Also, the portion in which the substrate 100 is exposed becomes a light transmitting region.

As is apparent from the foregoing description, according to the method for correcting a CD of a mask pattern, the correction process can be performed by forming a conductive high polymer layer using electrochemical polymerization of high polymer instead of using a lithography process. The conductive high polymer layer has excellent mechanical physical properties and thus can prevent damage of the frame region during the process of additionally etching the light shielding layer pattern and prevent defects due to particles resulted from the lithography process.

While the invention has been described with respect to the specific embodiments, various changes and modifications may be made without departing from the spirit and scope of the invention as defined in the following claims.

What is claimed is:

1. A method for correcting a critical dimension (CD) of a mask pattern, comprising:
   forming an light shielding layer over portions of a substrate that define a main cell region and a frame region at a periphery of the main cell region;
   patterning the light shielding layer to form an light shielding main pattern in the main cell region and a frame pattern in the frame region;
   measuring a CD of the light shielding main pattern to obtain a measured CD;
   extracting a CD correction amount from the measured CD;
   self-aligning a conductive high polymer layer over the frame pattern by electrochemical polymerization, said main pattern remaining exposed by the conductive high polymer layer;
   correcting the CD of the main pattern based on the CD correction amount by etching the main pattern exposed by the conductive high polymer layer; and
   selectively removing the conductive high polymer layer.

2. The method of claim 1, comprising forming the conductive high polymer layer by:
   placing the substrate in an electrolytic bath filled with electrolyte;
   introducing a counter electrode within the electrolyte and introducing a working electrode to the frame pattern;
   supplying monomer to be polymerized to the bath; and
   forming the conductive high polymer layer by inducing polymerization of the monomer over the frame pattern connected to the working electrode by applying a potential to the counter electrode and the working electrode.

3. The method of claim 1, wherein the conductive high polymer layer comprises a polypyrrole layer.

4. The method of claim 1, comprising removing the conductive high polymer layer by providing oxygen plasma onto the conductive high polymer layer.

5. A method for correcting a critical dimension (CD) of a mask pattern, comprising:
   forming a phase shift layer and an light shielding layer over a substrate that defines a main cell region and a frame region at a periphery of the main cell region;
   patterning the light shielding layer to form an light shielding main pattern in the main cell region and a frame pattern in the frame region;
   measuring a CD of the light shielding main pattern to obtain a measured CD;
   extracting a CD correction amount from the measured CD;
   self-aligning a conductive high polymer layer over the frame pattern by electrochemical polymerization, said main pattern remaining exposed;
   correcting the CD of the main pattern based on the CD correction amount by etching the main pattern exposed by the conductive high polymer layer;
   forming a phase shift pattern by selectively removing an exposed portion of the phase shift layer using the main pattern with corrected CD as an etch mask;
   exposing the phase shift pattern over the main region by selectively removing the main pattern with the frame pattern remaining; and
   selectively removing the conductive high polymer layer.

6. The method of claim 5, comprising forming the conductive high polymer layer by:
   placing the substrate in an electrolytic bath filled with electrolyte;
   introducing a counter electrode in the electrolyte and introducing a working electrode to the frame pattern;
   supplying monomer to be polymerized to the inside of the bath; and
   forming the conductive high polymer layer by inducing polymerization of the monomer over the frame pattern connected to the working electrode by applying a potential to the counter electrode and the working electrode.

7. The method of claim 5, wherein the conductive high polymer layer comprises a polypyrrole layer.

8. The method of claim 5, comprising removing the conductive high polymer layer by providing oxygen plasma onto the conductive high polymer layer.

* * * * *